United States Patent
Setlur et al.

(10) Patent No.: US 7,573,072 B2
(45) Date of Patent: Aug. 11, 2009

(54) PHOSPHOR AND BLENDS THEREOF FOR USE IN LEDS

(75) Inventors: Anant Achyut Setlur, Niskayuna, NY (US); Alok Mani Srivastava, Niskayuna, NY (US); Holly Ann Comanzo, Niskayuna, NY (US); Dan Hancu, Clifton Park, NY (US); Linda Jane Valyou Briel, Niskayuna, NY (US)

(73) Assignee: Lumination LLC, Valley View, OH (US)

( * ) Notice: Subject to any disclaimer, the term of this patent is extended or adjusted under 35 U.S.C. 154(b) by 0 days.

(21) Appl. No.: 10/797,784

(22) Filed: Mar. 10, 2004

(65) Prior Publication Data

US 2005/0199897 A1 Sep. 15, 2005

(51) Int. Cl.
  *H01L 33/00* (2006.01)
  *H01L 51/50* (2006.01)
  *C09K 11/79* (2006.01)

(52) U.S. Cl. .......................... 257/98; 257/40; 257/103; 252/301.4 R; 252/301.4 F (58) Field of Classification Search .......... 257/79–103; 252/301.4 R, 301.6 F
See application file for complete search history.

(56) References Cited

U.S. PATENT DOCUMENTS

| | | | | |
|---|---|---|---|---|
| 5,998,925 | A * | 12/1999 | Shimizu et al. | 313/503 |
| 6,147,667 | A * | 11/2000 | Yamazaki et al. | 345/92 |
| 6,168,892 | B1 * | 1/2001 | Ohara et al. | 430/45 |
| 6,243,151 | B1 * | 6/2001 | Nose et al. | 349/70 |
| 6,515,417 | B1 * | 2/2003 | Duggal et al. | 313/506 |
| 6,621,211 | B1 * | 9/2003 | Srivastava et al. | 313/503 |
| 6,685,852 | B2 | 2/2004 | Setlur et al. | |
| 7,064,480 | B2 * | 6/2006 | Bokor et al. | 313/503 |
| 2001/0000522 | A1 | 4/2001 | Dyer et al. | |
| 2001/0000622 | A1 * | 5/2001 | Reeh et al. | 257/98 |
| 2002/0174794 | A1 * | 11/2002 | Lowden et al. | 102/517 |
| 2003/0155856 | A1 * | 8/2003 | Shiiki et al. | 313/483 |
| 2003/0209705 | A1 * | 11/2003 | Emerson et al. | 257/14 |
| 2004/0056256 | A1 * | 3/2004 | Bokor et al. | 257/79 |
| 2006/0152157 | A1 * | 7/2006 | Jung et al. | 313/582 |

FOREIGN PATENT DOCUMENTS

| | | | |
|---|---|---|---|
| AT | 410 266 B | * | 3/2003 |
| EP | 0 087 745 A1 | * | 9/1983 |
| JP | 11-261105 | * | 9/1999 |
| WO | WO 01/89001 A2 | * | 11/2001 |
| WO | WO 02/11214 A1 | * | 2/2002 |
| WO | WO 03/080763 A1 | * | 10/2003 |

OTHER PUBLICATIONS

"Periodic Table, Atomic Properties of the Elkements", National Institute of Science and Technology (NIST SP 966 (Sep. 2003).*
Zou et al., "Combinatorial fabrication and studies of intense efficient ultraviolet-violet organic light-emittiing device arrays", Applied Physics Letters vol. 79 (issue 14), Oct. 1, 2001, pp. 2282-2284.*

* cited by examiner

*Primary Examiner*—Johannes P Mondt
(74) *Attorney, Agent, or Firm*—Faye Sharpe LLP (57) ABSTRACT

Phosphor compositions having the formula $(Ba,Sr,Ca)SiO_4$:Eu and light emitting devices including a semiconductor light source and the above phosphor. Also disclosed are blends of $(Ba,Sr,Ca)SiO_4$:Eu and one or more additional phosphors and light emitting devices incorporating the same. Preferred blends include $(Sr,Ba,Ca)_2SiO_4$:Eu and at least one of $(Sr,Mg,Ca,Ba,Zn)_2P_2O_7$:Eu,Mn; $(Ca,Sr,Ba,Mg)_5(PO_4)_3(Cl,F,OH)$:Eu,Mn; $(Sr,Ba,Ca)MgAl_{10}O_{17}$:Eu,Mn; and $Mg_4FGeO_6$:Mn$^{4+}$; and one or more garnet phosphors having the general formula $(Y,Gd,La,Lu,T,Pr,Sm)_3(Al,Ga,In)_5O_{12}$:Ce.

36 Claims, 4 Drawing Sheets

Fig. 6A

PHOSPHOR AND BLENDS THEREOF FOR USE IN LEDS

STATEMENT OF GOVERNMENT INTEREST

The U.S. Government has a paid-up license in this invention and the right in limited circumstances to require the patent owner to license others on reasonable terms as provided for by the terms of Contract No. 70NANB8H4022 awarded by the NIST.

BACKGROUND OF THE INVENTION

The present invention relates to phosphor compositions, particularly phosphors for use in lighting applications. More particularly, the present invention relates to a novel phosphor and a lighting apparatus employing these phosphors and blends thereof.

Light emitting diodes (LEDs) are semiconductor light emitters often used as a replacement for other light sources, such as incandescent lamps. They are particularly useful as display lights, warning lights and indicating lights or in other applications where colored light is desired. The color of light produce by an LED is dependent on the type of semiconducting material used in its manufacture.

Colored semiconductor light emitting devices, including light emitting diodes and lasers (both are generally referred to herein as LEDs), have been produced from Group III-V alloys such as gallium nitride (GaN). To form the LEDs, layers of the alloys are typically deposited epitaxially on a substrate, such as silicon carbide or sapphire, and may be doped with a variety of n and p type dopants to improve properties, such as light emission efficiency. With reference to the GaN-based LEDs, light is generally emitted in the UV and/or blue range of the electromagnetic spectrum. Until quite recently, LEDs have not been suitable for lighting uses where a bright white light is needed, due to the inherent color of the light produced by the LED.

LEDs rely on its semiconductor to emit light. The light is emitted as a result of electronic excitation of the semiconductor material. As radiation (energy) strikes atoms of the semiconductor material, an electron of an atom is excited and jumps to an excited (higher) energy state. The higher and lower energy states in semiconductor light emitters are characterized as the conduction band and the valence band, respectively. The electron, as it returns to its ground energy state, emits a photon. The photon corresponds to an energy difference between the exited state and ground energy state, and results in an emission of radiation.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum may be generated. Colored LEDs are often used in toys, indicator lights and other devices. Manufacturers are continuously looking for new colored phosphors for use in such LEDs to produce custom colors and higher luminosity.

In addition to colored LEDs, a combination of LED generated light and phosphor generated light may be used to produce white light. The most popular white LEDs consist of blue emitting GaInN chips. The blue emitting chips are coated with a phosphor that converts some of the blue radiation to a complimentary color, e.g. a yellow-green emission. Together, the blue and yellow-green radiation produces a white light. There are also white LEDs that utilize a UV emitting chip and a phosphor blend including red, green and blue emitting phosphors designed to convert the UV radiation to visible light.

One known yellow-whitish light emitting device comprises a blue light-emitting LED having a peak emission wavelength in the near UV-to-blue range (from about 315 nm to about 480 nm) combined with a yellow light-emitting phosphor, such as cerium doped yttrium aluminum garnet $Y_3Al_{4.9}O_{12-\delta}:Ce^{3+}$ ("YAG") wherein $\delta$ is typically between about −1 to 1. The phosphor absorbs a portion of the radiation emitted from the LED and converts the absorbed radiation to a yellow light. The remainder of the blue light emitted by the LED is transmitted through the phosphor and is mixed with the yellow light emitted by the phosphor. A viewer perceives the mixture of blue and yellow light, which in most instances is perceived as a whitish-yellow light.

While useful for some applications, a need exists for new phosphors for use in white light systems. Particularly, a phosphor for use alone or in blends in conjunction with UV or blue LEDs is desired having good spectral distribution, quantum efficiency, and absorption.

SUMMARY OF THE INVENTION

In a first aspect, the invention provides a white-light emitting device including a UV or blue semiconductor light source having a peak emission from about 250 to about 500 nm and a phosphor having the formula $(Sr,Ba,Ca)_2SiO_4:Eu$.

In a second aspect, the present invention provides a white light emitting device including a UV semiconductor light source having a peak emission of from about 250 to about 400 nm and a phosphor blend including $(Sr,Ba,Ca)_2SIO_4:Eu$, and one or more garnet phosphors having the general formula $(Y,Gd,La,Lu,T,Pr,Sm)_3(Al,Ga,In)_5O_{12}:Ce$ and a magnesium fluorogermanate phosphor having the formula $Mg_4FGeO_6:Mn^{4+}$ (MFG).

In a third aspect, there is provided a white light emitting device including a semiconductor light source emitting at from about 370 to about 500 nm and a phosphor blend including $(Sr,Ba,Ca)_2SIO_4:Eu$, and one or more of $(Sr,Mg,Ca,Ba,Zn)_2P_2O_7:Eu,Mn$ ("SPP"); $(Ca,Sr,Ba,Mg)_5(PO_4)_3(Cl,F,OH):Eu,Mn$ ("HALO"); $(Sr,Ba,Ca)MgAl_{10}O_{17}:Eu,Mn$ ("BAM, BAMn"); and $Mg_4FGeO_6:Mn^{4+}$ (MFG).

In a fourth aspect, there is provided a phosphor blend including $(Sr,Ba,Ca)_2SiO_4:Eu$ and at least one of $(Sr,Mg,Ca,Ba,Zn)_2P_2O_7:Eu,Mn$ ("SPP"); $(Ca,Sr,Ba,Mg)_5(PO_4)_3(Cl,F,OH):Eu,Mn$ ("HALO"); $(Sr,Ba,Ca)MgAl_{10}O_{17}:Eu,Mn$ ("BAM, BAMn"); and $Mg_4FGeO_6:Mn^{4+}$ (MFG); and one or more garnet phosphors having the general formula $(Y,Gd,La,Lu,T,Pr,Sm)_3(Al,Ga,In)_5O_{12}:Ce$.

DETAILED DESCRIPTION OF THE INVENTION

Phosphors convert radiation (energy) to visible light. Different combinations of phosphors provide different colored light emissions. The colored light that originates from the phosphors provides a color temperature. Novel phosphor compositions are presented herein as well as their use in LED and other light sources.

A phosphor conversion material (phosphor material) converts generated UV or blue radiation to a different wavelength visible light. The color of the generated visible light is dependent on the particular components of the phosphor material. The phosphor material may include only a single phosphor composition or two or more phosphors of basic color, for example a particular mix with one or more of a yellow and red phosphor to emit a desired color (tint) of light. As used herein, the term "phosphor material" is intended to include both a single phosphor as well as a blend of two or more phosphors.

It was determined that an LED lamp that produces a bright-white light would be useful to impart desirable qualities to LEDs as light sources. Therefore, in one embodiment of the invention, a luminescent material phosphor conversion material blend (phosphor blend) coated LED is disclosed for providing white light. The individual phosphors and a phosphor blend including the individual phosphors convert radiation at a specified wavelength, for example radiation from about 250 to 500 nm as emitted by a near UV or blue LED, into visible light. The visible light provided by the phosphor blend comprises a bright white light with high intensity and brightness.

Figure 1:
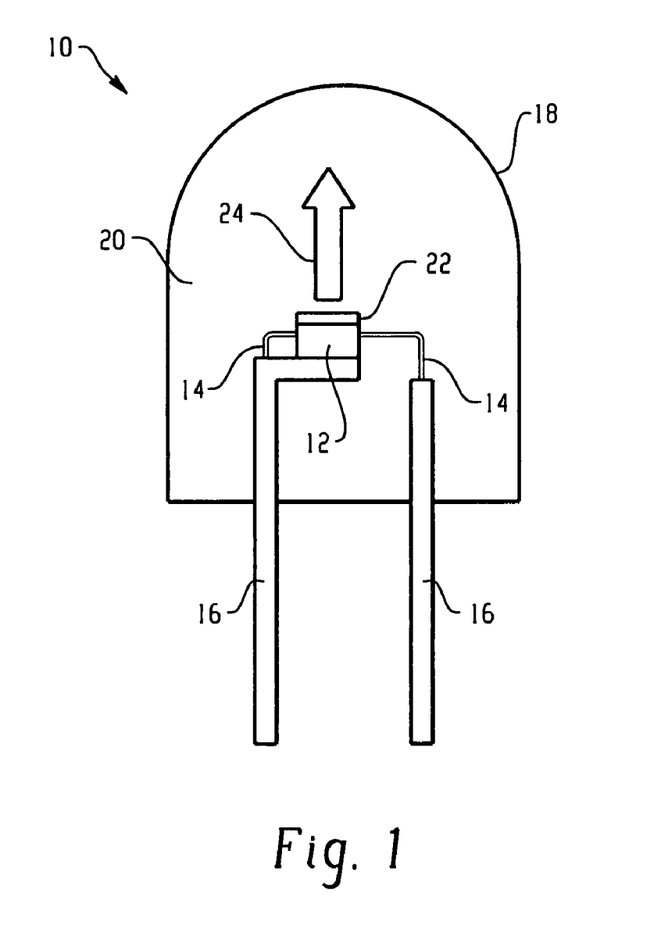
FIG. 1 is a schematic cross-sectional view of an illumination system in accordance with one embodiment of the present invention.

With reference to FIG. 1, an exemplary light emitting assembly or lamp 10 is shown in accordance with one preferred structure of the present invention. The light emitting assembly 10 comprises a semiconductor UV radiation source, such as a light emitting diode (LED) chip 12 and leads 14 electrically attached to the LED chip. The leads 14 may comprise thin wires supported by a thicker lead frame(s) 16 or the leads may comprise self supported electrodes and the lead frame may be omitted. The leads 14 provide current to the LED chip 12 and thus cause the LED chip 12 to emit radiation.

The lamp may include any semiconductor blue or UV light source that is capable of producing white light when its emitted radiation is directed onto the phosphor. In a preferred embodiment, the semiconductor light source comprises a blue emitting LED doped with various impurities. Thus, the LED may comprise a semiconductor diode based on any suitable III-V, II-VI or IV-IV semiconductor layers and preferably has an emission wavelength of about 250 to 500 nm. Preferably, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; $0 \leq k$ and $i+j+k=1$) having an emission wavelength greater than about 250 nm and less than about 500 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

Organic light emissive structures are known in the art. A common high-efficiency organic emissive structure is referred to as the double heterostructure LED. This structure is very similar to conventional, inorganic LED's using materials as GaAs or InP. In this type of device, a support layer of glass is coated by a thin layer of indium/tin oxide (ITO) to form the substrate for the structure. Next, a thin (100-500 Å) organic, predominantly hole-transporting, layer (HTL) is deposited on the ITO layer. Deposited on the surface of the HTL layer is a thin (typically, 50-100 Å) emissive layer (EL). If these layers are too thin, there may be breaks in the continuity of the film; as the thickness of the film increases, the internal resistance increases, requiring higher power consumption for operation. The emissive layer (EL) provides the recombination site for electrons, injected from a 100-500 Å thick electron transporting layer (ETL) that is deposited upon the EL, and holes from the HTL layer. The ETL material is characterized by considerably higher mobility for electrons than for charge deficient centers (holes).

Another known organic emissive structure is referred to as a single heterostructure. The difference in this structure relative to that of the double heterostructure is that the electroluminescent layer also serves as an ETL layer, eliminating the need for the ETL layer. However, this type of device, for efficient operation, must incorporate an EL layer having good electron transport capability, otherwise a separate ETL layer must be included, rendering the structure effectively the same as a double heterostructure.

A known alternative device structure for an LED is referred to as a single layer (or polymer) LED. This type of device includes a glass support layer coated by a thin ITO layer, forming the base substrate. A thin organic layer of spin-coated polymer, for example, is then formed over the ITO layer, and provides all of the functions of the HTL, ETL, and EL layers of the previously described devices. A metal electrode layer is then formed over the organic polymer layer. The metal is typically Mg, Ca, or other conventionally used metals.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other high index of refraction material. Preferably, the encapsulant material 20 is an epoxy or a polymer material, such as silicone. Both the shell 18 and the encapsulant 20 are preferably transparent or substantially optically transmissive with respect to the wavelength of light produced by the LED chip 12 and a phosphor composition 22 (described below). Alternately, the lamp may 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame.

The structure of the illumination system includes a phosphor composition 22 radiationally coupled to the LED chip 12. Radiationally coupled means that the elements are associated with each other so radiation from one is transmitted to the other. In a preferred embodiment, the phosphor composition 22 is a blend of two or more phosphors, as will be detailed below. This phosphor composition 22 is deposited on the LED chip 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of the phosphor composition 22 and LED 12. Thus, the phosphor composition 22 may be coated over or directly on the light emitting surface of the LED chip 12 by coating and drying the phosphor suspension over the LED chip 12. Both the shell 18 and the encapsulant 20 are preferably transparent or otherwise designed to allow white light 24 to be transmitted through those elements. Although not intended to be limiting, in one embodiment, the median particle size of the phosphor composition may be from about 1 to about 10 microns.

Figure 2:
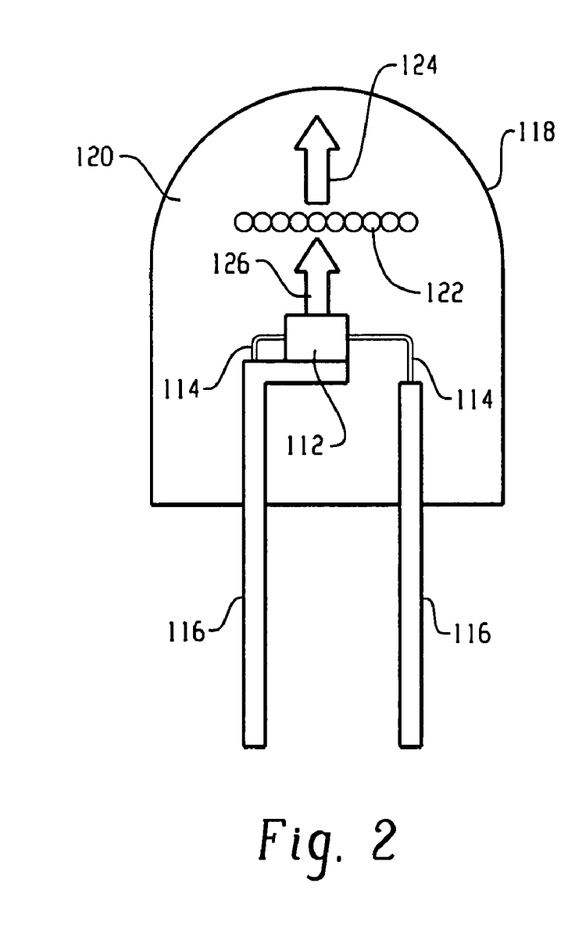
FIG. 2 is a schematic cross-sectional view of an illumination system in accordance with a second embodiment of the present invention.

FIG. 2 illustrates a second preferred structure of the system according to the preferred aspect of the present invention. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material 120 or, more preferably, throughout the entire volume of the encapsulant material. Blue or UV light 126 emitted by the LED chip 112 mixes with the light emitted by the phosphor composition 122, and the mixed light appears as white light 124. If the phosphor is to be interspersed within the encapsulant material 120, then a phosphor powder may be added to a polymer precursor, loaded around the LED chip 112, and then the polymer precursor may be cured to solidify the polymer material. Other known phosphor interspersion methods may also be used, such as transfer loading.

Figure 3:
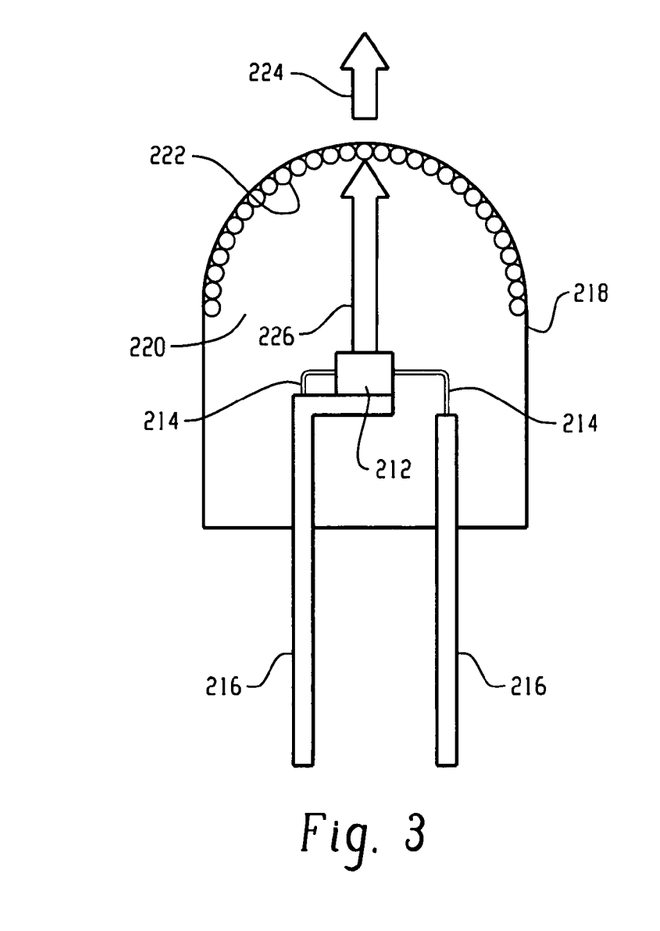
FIG. 3 is a schematic cross-sectional view of an illumination system in accordance with a third embodiment of the present invention.

FIG. 3 illustrates a third preferred structure of the system according to the preferred aspects of the present invention. The structure of the embodiment shown in FIG. 3 is similar to that of FIG. 1, except that the phosphor composition 222 is coated onto a surface of the shell 218, instead of being formed over the LED chip 212. The phosphor composition is preferably coated on the inside surface of the shell 218, although the phosphor may be coated on the outside surface of the shell, if desired. The phosphor composition 222 may be coated on the entire surface of the shell or only a top portion of the surface of the shell. The blue or UV light 226 emitted by the LED chip 212 mixes with the light emitted by the phosphor composition 222, and the mixed light appears as white light 224. Of course, the structures of FIGS. 1-3 may be combined and the phosphor may be located in any two or all three locations or in any other suitable location, such as separately from the shell or integrated into the LED.

In any of the above structures, the lamp 10 may also include a plurality of scattering particles (not shown), which are embedded in the encapsulant material. The scattering particles may comprise, for example, $Al_2O_3$ particles such as alumina powder or $TiO_2$ particles. The scattering particles effectively scatter the coherent light emitted from the LED chip, preferably with a negligible amount of absorption.

Figure 4:
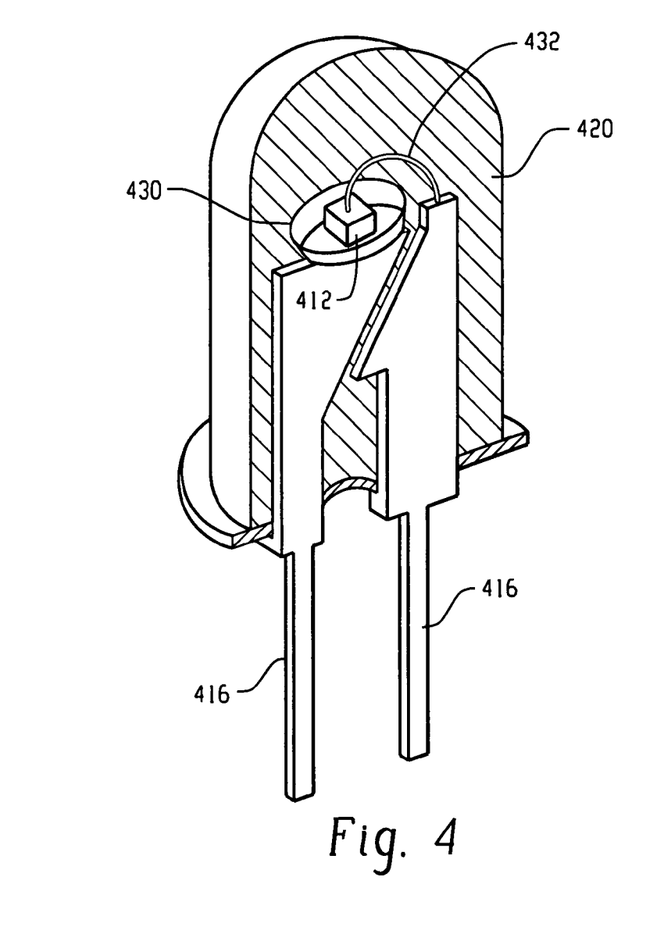
FIG. 4 is a cutaway side perspective view of an illumination system in accordance with a fourth embodiment of the present invention.

As shown in a fourth preferred structure in FIG. 4, the LED chip 412 may be mounted in a reflective cup 430. The cup 430 may be made from or coated with a reflective material, such as alumina, titania, or other dielectric powder known in the art. A preferred reflective material is $Al_2O_3$. The remainder of the structure of the embodiment of FIG. 4 is the same as that of any of the previous Figures, and includes two leads 416, a conducting wire 432 electrically connecting the LED chip 412 with the second lead, and an encapsulant material 420.

In one embodiment, the invention provides a novel phosphor composition, which may be used in the phosphor composition 22 in the above described LED light, having the general formula $(Sr,Ba,Ca)_2SiO_4$:Eu. As used herein with respect to the above described phosphor, Eu is meant to denote the $Eu^{2+}$ ion. The amount of $Eu^{2+}$ doping in the phosphor will preferably range from about 0.001 to 0.2. Thus, in this embodiment, the phosphor can be described as having the formula $(Ba,Sr,Ca)_2SiO_{04}:Eu_m$, where m is from 0.001 to 0.2. A preferred phosphor composition has the formula $(Sr_{0.95}Ba_{0.025}Eu_{0.025})_2SiO_4$. A second preferred phosphor composition has the formula $(Sr_{0.58}Ca_{0.36}Eu_{0.06})_2SiO_4$. When used with an LED emitting at from 250 to 500 nm and optionally with one or more additional phosphors, the resulting lighting system will produce a light having a white color, the characteristics of which will be discussed in more detail below.

Figure 5:
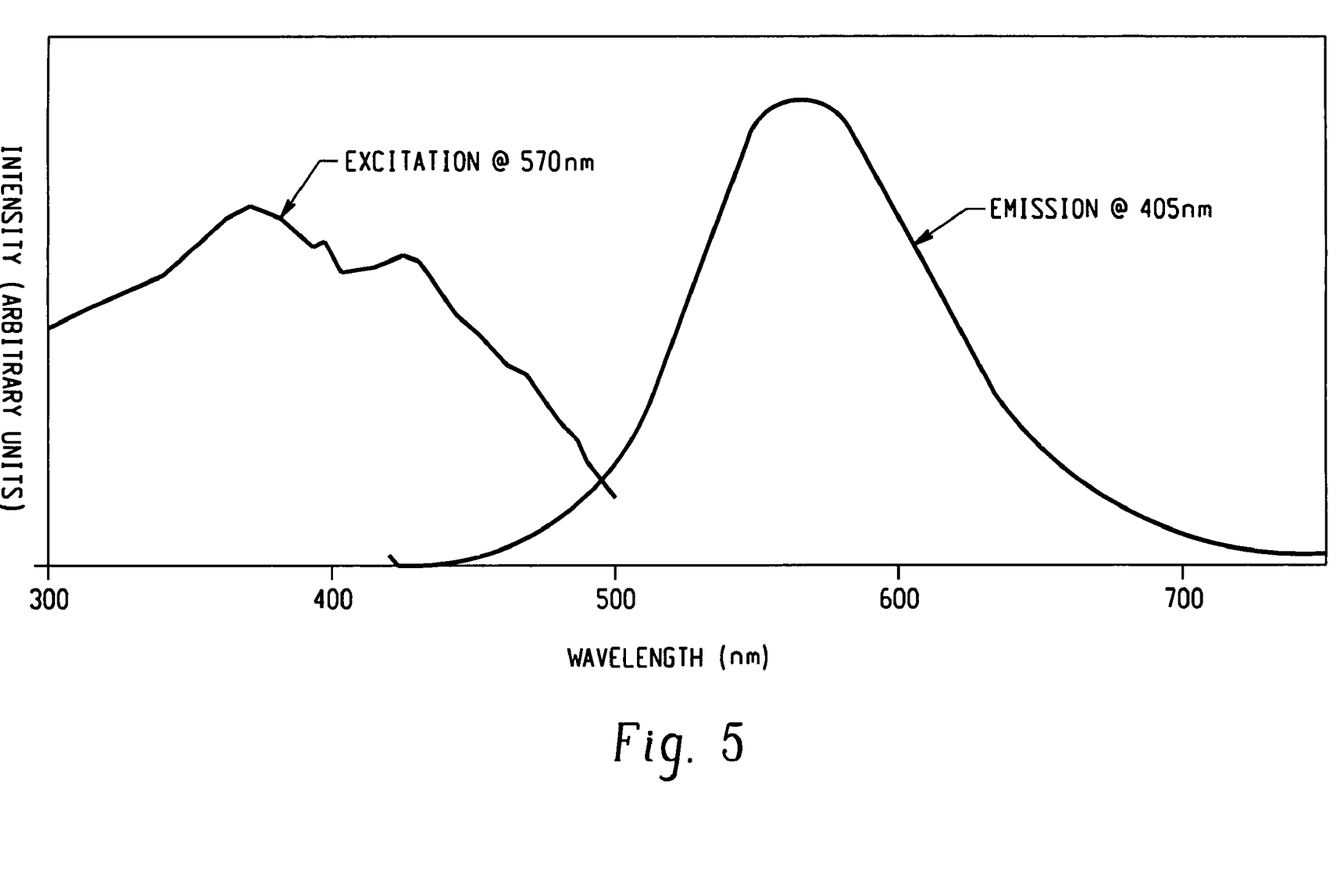
FIG. 5 is a graph of the emission and absorption spectra of a phosphor according to the present invention having the formula $(Sr_{0.95}Ba_{0.025}Eu_{0.025})_2SiO_4$.

The above described formulation produces a phosphor with a stronger UV absorption compared to conventional UV LED phosphors, reducing the amount of UV bleedthrough in white lamps utilizing UV chips. This effect is shown in FIG. 5, which shows the absorption and emission spectra of a phosphor having the formula $(Sr_{0.95}Ba_{0.025}EU_{0.025})_2SiO_4$. The excitation spectra shows that there is significant absorption of UV and blue light in the relevant ranges for current UV/blue LED chips. Correspondingly, this phosphor may be used in white LEDs utilizing either blue or UV LED chips as the excitation source. For blue LED chips, the phosphor will convert a portion of the incident blue radiation into yellow or green light. When combined, the blue and yellow or green lights will produce a white light. The color of the phosphor can be tuned by changing the Ba/Sr/Ca ratio. Thus, the phosphor can be adjusted to optimize the blend luminosity and CRI depending on the product application.

Figure 6A:
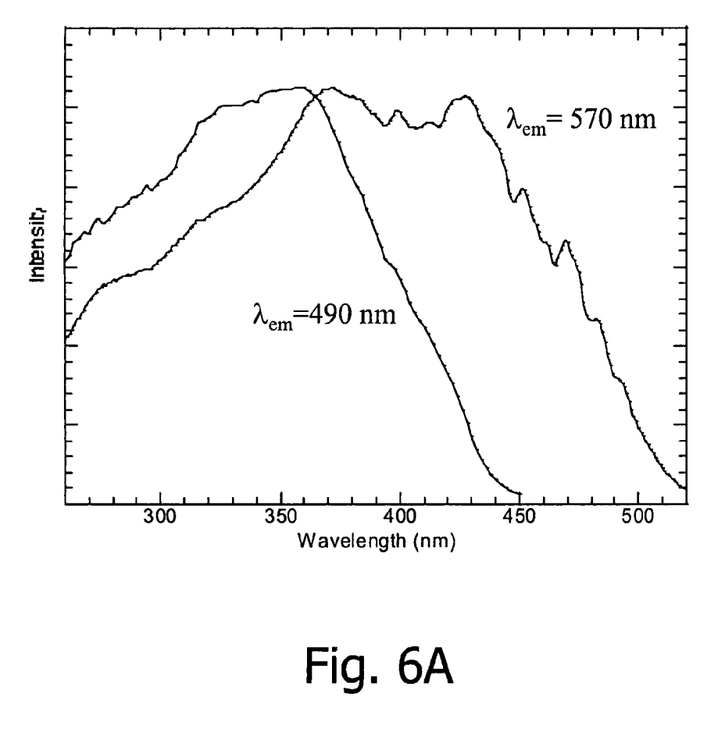
FIGS. 6A and 6B are the absorption and emission spectra, respectively, of a phosphor according to the present invention having the formula $(Sr_{0.58}Ca_{0.36}Eu_{0.06})_2SiO_4$ at two different wavelengths.
Figure 6B:
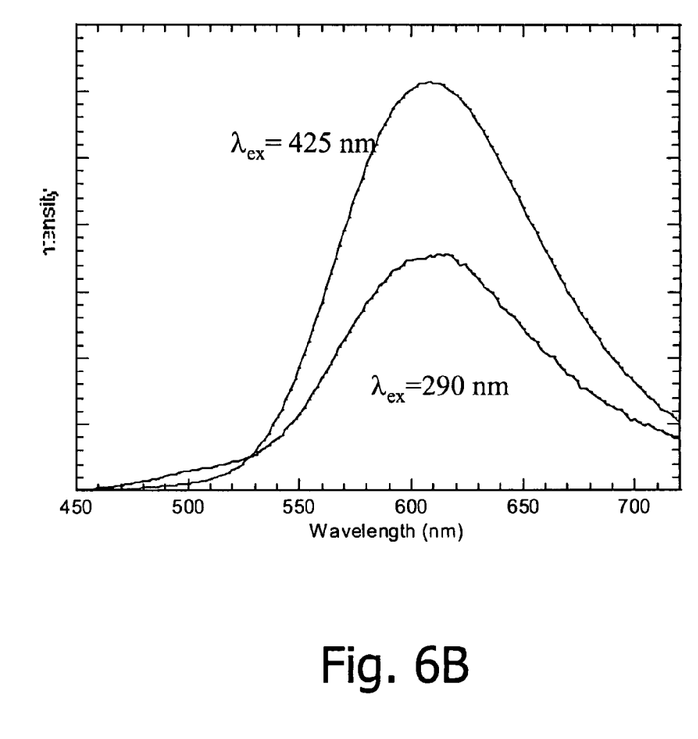

Similarly, FIGS. 6A and 6B show the absorption and emission spectra for $(Sr_{0.58}Ca_{0.36}Eu_{0.06})_2SiO_4$ at two different wavelengths. Strong absorption from about 275 to 475 nm can be seen.

The above described phosphor compositions may be produced using known solid state reaction processes for the production of phosphors by combining, for example, elemental oxides, carbonates and/or hydroxides as starting materials. Other starting materials may include nitrates, sulfates, acetates, citrates, or oxalates. Thus, for example, $(Sr_{0.58}Ca_{0.36}Eu_{0.06})_2SiO_4$ may be produced using predetermined amounts of $SrCO_3$, $CaCO_3$, $Eu_2O_3$, and $SiO_2$. In a typical process, the starting materials are combined via a dry or wet blending process and fired in air or under a reducing atmosphere at from, e.g., 900 to 1600° C.

A fluxing agent may be added to the mixture before or during the step of mixing. This fluxing agent may be $NH_4Cl$ or any other conventional fluxing agent, such as other chloride or borate compounds. A quantity of a fluxing agent of less than about 20, preferably less than about 10, percent by weight of the total weight of the mixture is adequate for fluxing purposes.

The starting materials may be mixed together by any mechanical method including, but not limited to, stirring or blending in a high-speed blender or a ribbon blender. The starting materials may be combined and pulverized together in a bowl mill, a hammer mill, or a jet mill. The mixing may be carried out by wet milling especially when the mixture of the starting materials is to be made into a solution for subsequent precipitation. If the mixture is wet, it may be dried first before being fired under a reducing atmosphere at a temperature from about 900° C. to about 1700° C., preferably from about 900° C. to about 1500° C., for a time sufficient to convert all of the mixture to the final composition, which may typically range from about 2 to 12 hours.

The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate. The reducing atmosphere typically comprises a reducing gas such as hydrogen, carbon monoxide, or a combination thereof, optionally diluted with an inert gas, such as nitrogen, helium, neon, argon, krypton, xenon, or a combination thereof. Alternatively, the crucible containing the mixture may be packed in a second closed crucible containing high-purity carbon particles and fired in air so that the carbon particles react with the oxygen present in air, thereby, generating carbon monoxide for providing a reducing atmosphere.

While suitable for use alone with a blue or UV LED chip, the above phosphor compositions may be blended with one or more additional phosphors for use in white LED light sources. Thus, in another embodiment, an LED lighting assembly is provided including a phosphor composition 22 comprising a blend of a phosphor from one of the above embodiments with one or more additional phosphors.

Thus, in a second embodiment, there is provided a white light emitting device including a UV emitting LED chip emitting at from about 250 to about 400 nm and a phosphor blend including the above described $(Sr,Ba,Ca)_2SiO_4$:Eu phosphor, and one or more garnet phosphors having the general formula $(Y,Gd,La,Lu,T,Pr,Sm)_3(Al,Ga,In,)_5O_{12}$:Ce and a magnesium fluorogermanate phosphor having the formula $Mg_4FGeO_6$:$Mn^{4+}$ (MFG). The relative amounts of each phosphor in the phosphor blend can be described in terms of spectral weight. The spectral weight is the relative amount that each phosphor contributes to the overall emission spectra of the phosphor blend. The spectral weight amounts of all the individual phosphors should add up to 1. In a preferred embodiment, each of the above described phosphors in the blend will have a spectral weight ranging from about 0.01 to 0.7.

In a third embodiment, there is provided a white light emitting device including a UV emitting LED chip emitting at from about 370 to about 500 nm and a phosphor blend including the above described $(Sr,Ba,Ca)_2SiO_4$:Eu phosphor, and one or more of $(Sr,Mg,Ca,Ba,Zn)_2P_2O_7$:Eu,Mn ("SPP"); (Ca,Sr,Ba,Mg)$_5$(PO$_4$)$_3$(Cl,F,OH):Eu,Mn ("HALO"); (Sr,Ba,Ca)MgAl$_{10}$O$_{17}$:Eu,Mn ("BAM, BAMn"); and $Mg_4FGeO_6$:$Mn^{4+}$ (MFG). Again, in a preferred embodiment, each of the above described phosphors, when present in the blend, will have a spectral weight ranging from about 0.01 to 0.7.

Depending on the exact formulation, the $(Sr,Ba,Ca)_2SiO_4$:Eu phosphor may have a quantum efficiency of about 50% or greater of a typical YAG:Ce phosphor and about 60% or greater of an SPP phosphor. In addition, $(Sr_{0.95}Ba_{0.025}Eu_{0.025})_3Al_5O_{12}SiO_4$ has an absorption of 60% at 450 nm and 76% at 405 nm, compared to about 57% for an SPP phosphor at 405 nm.

In addition, other phosphors such as green, blue, orange, or other color phosphors may be used in the blend to customize the white color of the resulting light and produce higher CRI sources. While not intended to be limiting, suitable phosphor for use in the blend with the present invention phosphors include:

BLUE:
$(Ba,Sr,Ca)_5(PO_4)_3(Cl,F,Br, OH)$:$Eu^{2+}$, $Mn^{2+}$, $Sb^{3+}$
$(Ba,Sr,Ca)MgAl_{10}O_{17}$:$Eu^{2+}$,$Mn^{2+}$
$(Ba,Sr,Ca)BPO_5$:$Eu^{2+}$, $Mn^{2+}$
$(Sr,Ca)_{10}(PO_4)_6*nB_2O_3$:$Eu^{2+}$
$2SrO*0.84P_2O_5*0.16B_2O_3$:$Eu^{2+}$
$Sr_2Si_3O_8*_2SrCl_2$:$Eu^{2+}$
$Ba_3MgSi_2O_8$:$Eu^{2+}$
$Sr_4Al_{14}O_{25}$:$Eu^{2+}$ (SAE)
$BaAl_8O_{13}$:$Eu^{2+}$

BLUE-GREEN:
$Sr_4Al_{14}O_{25}$:$Eu^{2+}$
$BaAl_8O_{13}$:$Eu^{2+}$
$2SrO-0.84P_2O_{5-0.16}B_2O_3$:$Eu^{2+}$
$(Ba,Sr,Ca)MgAl_{10}O_{17}$:$Eu^{2+}$,$Mn^{2+}$
$(Ba,Sr,Ca)_5(PO_4)_3(Cl,F,OH)$:$Eu^{2+}$,$Mn^{2+}$, $Sb^{3+}$

GREEN:
$(Ba,Sr,Ca)MgAl_{10}O_{17}$:$Eu^{2+}$,$Mn^{2+}$ (BAMn)
$(Ba,Sr,Ca)Al_2O_4$:$Eu^{2+}$
$(Y,Gd,Lu,Sc,La)BO_3$:$Ce^{3+}$,$Tb^{3+}$
$Ca_8Mg(SiO_4)_4Cl_2$:$Eu^{2+}$,$Mn^{2+}$
$(Ba,Sr,Ca)_2(Mg,Zn)Si_2O_7$:$Eu^{2+}$
$(Sr,Ca,Ba)(Al,Ga,In)_2S_4$:$Eu^{2+}$
$(Y,Gd,Tb,La,Sm,Pr, Lu)_3(Al,Ga)_5O_{12}$:$Ce^{3+}$
$(Ca,Sr)_8(Mg,Zn)(SiO_4)_4Cl_2$:$Eu^{2+}$, $Mn^{2+}$ (CASI)
$Na_2Gd_2B_2O_7$:$Ce^{3+}$, $Tb^{3+}$
$(Ba,Sr)_2(Ca,Mg,Zn)B_2O_6$:K,Ce,Tb

YELLOW-ORANGE:
$(Sr,Ca,Ba,Mg,Zn)_2P_2O_7$:$Eu^{2+}$, $Mn^{2+}$ (SPP);
$(Ca,Sr,Ba,Mg)_{10}(PO_4)_6(F,Cl,Br,OH)$: $Eu^{2+}$,$Mn^{2+}$ (HALO);

RED:
$(Gd,Y,Lu,La)_2O_3$:$Eu^{3+}$,$Bi^{3+}$
$(Gd,Y,Lu,La)_2O_2S$:$Eu^{3+}$,$Bi^{3+}$
$(Gd,Y,Lu,La)VO_4$:$Eu^{3+}$,$Bi^{3+}$
$(Ca,Sr)S$:$Eu^{2+}$
$SrY_2S_4$:$Eu^{2+}$
$CaLa_2S_4$:$Ce^{3+}$
$(Ca,Sr)S$:$Eu^{2+}$
$3.5MgO*0.5MgF_2*GeO_2$:$Mn^{4+}$
$(Ba,Sr,Ca)MgP_2O_7$:$Eu^{2+}$,$Mn^{2+}$
$(Y,Lu)_2WO_6$:$Eu^{3+}$, $Mo^{6+}$
$(Ba,Sr,Ca)_xSi_yN_z$:$Eu^{2+}$

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined ccx and ccy values on the CIE chromaticity diagram. As stated, a white light is preferably produced. This white light may, for instance, may possess an ccx value in the range of about 0.30 to about 0.45, and a ccy value in the range of about 0.30 to about 0.45. As stated, however, the exact identity and amounts of each phosphor in the phosphor composition can be varied according to the needs of the end user.

The phosphors of the present invention show a unique color shift compared to comparable known phosphors. For example, $(Sr_{0.58}Ca_{0.36}Eu_{0.06})_2SiO_4$ possesses a color point having a ccx value of 0.5286 and a ccy value of 0.4604 using a 405 nm excitation wavelength.

Various phosphor compositions according to the above embodiments were manufactured. The color coordinates of these phosphors were measured and the luminosity (lm/W) color rendering index (CRI) and coordinated color temperature (CCT) of these blends were determined using a 405 nm excitation wavelength. The results are shown below in Table 1.

TABLE 1

| Phosphor Composition | Luminosity | ccx | ccy | CCT | CRI |
|---|---|---|---|---|---|
| SPP + $(Sr_{0.95}Ba_{0.025}Eu_{0.025})_2SiO_4$ + BAM | 375 | 0.389 | 0.410 | 4000 | 64 |
| $(Sr_{0.95}Ba_{0.025}Eu_{0.025})_2SiO_4$ + BAM | 348 | 0.339 | 0.373 | 5200 | 69 |
| SPP + SAE | 347 | 0.389 | 0.410 | 4000 | 76 |
| SPP + BAM + BAMn | 361 | 0.389 | 0.410 | 4000 | 76 |

As can be seen from the above chart, blending studies show that a $(Sr_{0.95}Ba_{0.025}Eu_{0.025})_2SiO_4$ phosphor blended with SPP and BAM provide a luminosity improvement of about 8% over state of the art blends without $(Sr_{0.95}Ba_{0.025}EU_{0.025})_2SiO_4$ with a reduction in CRI from 76 to 64.

The phosphor compositions described above may be used in additional applications besides LEDs. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are meant to be merely exemplary and not exhaustive.

The invention has been described with reference to various preferred embodiments. Modifications and alteration will occur to others upon a reading and understanding of this specification. The invention is intended to include all such modifications and alterations insofar as they come within the scope of the appended claims or the equivalent thereof.

What is claimed is:

1. A lighting apparatus for emitting white light comprising: a semiconductor light source emitting radiation having a peak emission in the UV; and a phosphor composition radiationally coupled to the light source, the phosphor composition comprising (Ba,Sr,Ca)SiO$_4$:Eu, one or more garnet phosphors having the general formula (Y,Gd,La,Lu,Tb,Pr,Sm)$_3$(Al,Ga,In)$_5$O$_{12}$:Ce, and at least one phosphor selected from the group consisting of (Sr,Mg,Ca,Ba,Zn)$_2$P$_2$O$_7$:Eu,Mn; (Ca,Sr,Ba,Mg)$_5$(PO$_4$)$_3$(Cl,F,OH):Eu,Mn; and (Sr,Mg,Ca,)MgAl$_{10}$O$_{17}$:Eu,Mn, wherein said (Ba,Sr,Ca)SiO$_4$:Eu phosphor comprises $(Sr_{0.95}Ba_{0.025}Eu_{0.025})_2SiO_4$ or $(Sr_{0.58}Ca_{0.036}Eu_{0.06})_2SiO_4$.

2. The lighting apparatus of claim 1, wherein the light source is an LED.

3. The lighting apparatus of claim 2, wherein the LED comprises a nitride compound semiconductor represented by the formula In$_i$Ga$_j$Al$_k$N, where $0 \leq i$; $0 \leq j$, $0 \leq k$, and $i+j+k=1$.

4. The lighting apparatus of claim 1, wherein the light source is an organic emissive structure.

5. The lighting apparatus of claim 1, wherein the phosphor composition is coated on the surface of the light source.

6. The lighting apparatus of claim 1, further comprising an encapsulant surrounding the light source and the phosphor composition.

7. The lighting apparatus of claim 1, wherein the phosphor composition is dispersed in the encapsulant.

8. The lighting apparatus of claim 1, further comprising a reflector cup.

9. The lighting apparatus of claim 1, wherein said apparatus has a color point with ccx value of 0.5286 and a ccy value of 0.4604.

10. The lighting apparatus of claim 1, wherein said phosphor composition further comprises one or more additional phosphor.

11. The lighting apparatus of claim 10, wherein said one or more additional phosphors are selected from the group consisting of (Ba,Sr,Ca)$_5$(PO$_4$)$_3$(Cl,F,Br,OH):Eu$^{2+}$,Mn$^{2+}$,Sb$^{3+}$; (Ba,Sr,Ca)MgAl$_{10}$O$_{17}$:Eu$^{2+}$,Mn$^{2+}$; (Ba,Sr,Ca)BPO$_5$:Eu$^{2+}$,Mn$^{2+}$; (Sr,Ca)$_{10}$(PO$_4$)$_6$*nB$_2$O$_3$:Eu$^{2+}$; 2SrO*0.84P$_2$O$_5$*0.16B$_2$O$_3$:Eu$^{2+}$; Sr$_2$Si$_3$O$_{8}$*2SrCl$_2$:Eu$^{2+}$; Ba$_3$MgSi$_2$O$_8$:Eu$^{2+}$; Sr$_4$Al$_{14}$O$_{25}$:Eu$^{2+}$; BaAl$_8$O$_{13}$:Eu$^{2+}$; (Ba,Sr,Ca)Al$_2$O$_4$:Eu$^{2+}$; (Y,Gd,Lu,Sc,La)BO$_3$:Ce$^{3+}$,Tb$^{3+}$; (Ba,Sr,Ca)$_2$(Mg,Zn)Si$_2$O$_7$:Eu$^{2+}$; (Sr,Ca,Ba)(Al,Ga,In)$_2$S$_4$:Eu$^{2+}$; (Y,Gd,Tb,La,Sm,Pr, Lu)3(Al,Ga)$_5$O$_{12}$:Ce$^{3+}$; (Ca,Sr)$_8$(Mg,Zn)(SiO$_4$)$_4$Cl$_2$:Eu$^{2+}$,Mn$^{2+}$; Na$_2$Gd$_2$B$_2$O$_7$:Ce$^{3+}$,Tb$^{3+}$; (Ba,Sr)$_2$(Ca,Mg,Zn)B$_2$O$_6$:K,Ce,Tb; (Sr,Ca,Ba,Mg,Zn)$_2$P$_2$O$_7$:Eu$^{2+}$,Mn$^{2+}$; (Ca,Sr,Ba,Mg)$_{10}$(PO$_4$)$_6$(F,Cl,Br,OH):Eu$^{2+}$,Mn$^{2+}$; (Gd,Y,Lu,La)$_2$O$_3$:Eu$^{3+}$,Bi$^{3+}$; (Gd,Y,Lu,La)$_2$O$_2$S:Eu$^{3+}$,Bi$^{3+}$; (Gd,Y,Lu,La)VO$_4$:Eu$^{3+}$,Bi$^{3+}$; (Ca,Sr)S:Eu$^{2+}$; SrY$_2$S$_4$:Eu$^{2+}$; CaLa$_2$S$_4$:Ce$^{3+}$; (Ca,Sr)S:Eu$^{2+}$; 3.5MgO*0.5MgF$_2$*GeO$_2$:Mn$^{4+}$; (Ba,Sr,Ca)MgP$_2$O$_7$:Eu$^{2+}$,Mn$^{2+}$; (Y,Lu)$_2$WO$_6$:Eu$^3$+,Mo$^{6+}$; and (Ba,Sr,Ca)$_x$Si$_y$N$_z$:Eu$^{2+}$.

12. A lighting apparatus for emitting white light comprising:
a UV light source emitting radiation having a peak emission in the UV range; and
a phosphor composition radiationally coupled to the light source, the phosphor composition comprising (Sr,Ba,Ca)$_2$SiO$_4$:Eu, one or more garnet phosphors having the general formula (Y,Gd,La,Lu,Tb,Pr,Sm)$_3$(Al,Ga,In)$_5$O$_{12}$:Ce and a magnesium fluorogermanate phosphor, wherein said (Sr,Br,Ca)$_2$SiO$_4$:Eu phosphor comprises $(Sr_{0.95}Ba_{0.025}Eu_{0.025})_2SiO_4$ or $(Sr_{0.58}Ca_{0.036} Eu_{0.06})_2SiO_4$.

13. The lighting apparatus of claim 12, wherein the light source is a semiconductor LED.

14. The lighting apparatus of claim 12, wherein the LED comprises a nitride compound semiconductor represented by the formula In$_i$Ga$_j$Al$_k$N, where $0 \leq i$; $0 \leq j$, $0 \leq k$, and $i+j+k=1$.

15. The lighting apparatus of claim 12, wherein said light source is an organic emissive structure.

16. The lighting apparatus of claim 12, wherein the phosphor composition is coated on the surface of the light source.

17. The lighting apparatus of claim 12, further comprising an encapsulant surrounding the light source and the phosphor composition.

18. The lighting apparatus of claim 12, wherein the phosphor composition is dispersed in the encapsulant.

19. The lighting apparatus of claim 12, further comprising a reflector cup.

20. The lighting apparatus of claim 12, wherein said apparatus has a color point with ccx value of 0.5286 and a ccy value of 0.4604.

21. The lighting apparatus of claim 12, wherein said phosphor composition further comprises one or more additional phosphors.

22. The lighting apparatus of claim 21, wherein said one or more additional phosphors are selected from the group consisting of $(Ba,Sr,Ca)_5(PO_4)_3(Cl,F,Br,OH):Eu^{2+},Mn^{2+},Sb^{3+}$; $(Ba,Sr,Ca)MgAl_{10}O_{17}:Eu^{2+},Mn^{2+}$; $(Ba,Sr,Ca)BPO_5:Eu^{2+},Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_{8*2}SrCl_2:Eu^{2+}$; $Ba_3MgSi_2O_8:Eu^{2+}$; $Sr_4Al_{14}O_{25}:Eu^{2+}$; $BaAl_8O_{13}:Eu^{2+}$; $(Ba,Sr,Ca)Al_2O_4:Eu^{2+}$; $(Y,Gd,Lu,Sc,La)BO_3:Ce^{3+},Tb^{3+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr, Lu)3(Al,Ga)_5O_{12}:Ce^{3+}$; $(Ca,Sr)_8(Mg,Zn)(SiO_4)_4Cl_2:Eu^{2+},Mn^{2+}$; $Na_2Gd_2B_2O_7:Ce^{3+},Tb^{3+}$; $(Ba,Sr)_2(Ca,Mg,Zn)B_2O_6:K,Ce,Tb$; $(Sr,Ca,Ba,Mg,Zn)_2P_2O_7:Eu^{2+},Mn^{2+}$; $(Ca,Sr,Ba,Mg)_{10}(PO_4)_6(F,Cl,Br,OH):Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$; $(Ba,Sr,Ca)MgP_2O_7:Eu^{2+},Mn^{2+}$; $(Y,Lu)_2WO_6:Eu^{3+},Mo^{6+}$; $(Ba,Sr,Ca)_xSi_yN_z:Eu^{2+}$.

23. A lighting apparatus for emitting white light comprising:
   a semiconductor light source emitting radiation having a peak emission in the UV range; and
   a phosphor composition radiationally coupled to the light source, the phosphor composition comprising $(Ba,Sr,Ca)SiO_4:Eu$, and one or more additional phosphors, wherein said $(Ba,Sr,Ca)SiO_4:Eu$ phosphor comprises $(Sr_{0.95}Ba_{0.025} Eu_{0.025})_2SiO_4$ or $(Sr_{0.58}Ca_{0.036} Eu_{0.06})_2SiO_4$.

24. The lighting apparatus of claim 23, wherein the light source is a semiconductor LED.

25. The lighting apparatus of claim 23, wherein the LED comprises a nitride compound semiconductor represented by the formula $In_iGa_jAl_kN$, where $0 \leq i$; $0 \leq j$, $0 \leq k$, and $i+j+k=1$.

26. The lighting apparatus of claim 23, wherein said light source is an organic emissive structure.

27. The lighting apparatus of claim 23, wherein the phosphor composition is coated on the surface of the light source.

28. The lighting apparatus of claim 23, further comprising an encapsulant surrounding the light source and the phosphor composition.

29. The lighting apparatus of claim 23, wherein the phosphor composition is dispersed in the encapsulant.

30. The lighting apparatus of claim 23, further comprising a reflector cup.

31. The lighting apparatus of claim 23, wherein said apparatus has a color point with a ccx value or 0.52 86 and a ccy value of 0.4604.

32. The lighting apparatus of claim 28, wherein said one or more additional phosphors are selected from the group consisting of $(Ba,Sr,Ca)_5(PO_4)_3(Cl,F,Br,OH):Eu^{2+},Mn^{2+},Sb^{3+}$; $(Ba,Sr,Ca)MgAl_{10}O_{17}:Eu^{2+},Mn^{2+}$; $(Ba,Sr,Ca)BPO_5:Eu^{2+},Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_{8*2}SrCl_2:Eu^{2+}$; $Ba_3MgSi_2O_8:Eu^{2+}$; $Sr_4Al_{14}O_{25}:Eu^{2+}$; $BaAl_8O_{13}:Eu^{2+}$; $(Ba,Sr,Ca)Al_2O_4:Eu^{2+}$; $(Y,Gd,Lu,Sc,La)BO_3:Ce^{3+},Tb^{3+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr, Lu)3(Al,Ga)_5O_{12}:Ce^{3+}$; $(Ca,Sr)_8(Mg,Zn)(SiO_4)_4Cl_2:Eu^{2+},Mn^{2+}$; $Na_2Gd_2B_2O_7:Ce^{3+},Tb^{3+}$; $(Ba,Sr)_2(Ca,Mg,Zn)B_2O_6:K,Ce,Th$; $(Sr,Ca,Ba,Mg,Zn)_2P_2O_7:Eu^{2+},Mn^{2+}$; $(Ca,Sr,Ba,Mg)_{10}(PO_4)_6(F,Cl,Br,OH):Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$; $(Ba,Sr,Ca)MgP_2O_7:Eu^{2+},Mn^{2+}$; $(Y,Lu)_2WO_6:Eu^{3+},Mo^{6+}$; $(Ba,Sr,Ca)_xSi_yN_z:Eu^{2+}$.

33. A phosphor blend including $(Sr,Ba,Ca)_2SiO_4:Eu$ and at least one of $(Sr,Mg,Ca,Ba,Zn)_2P_2O_7:Eu,Mn$; $(Ca,Sr,Ba,Mg)_5(PO_4)_3(Cl,F,OH):Eu,Mn$; and $(Sr,Ba,Ca)MgAl_{10}O_{17}:Eu,Mn$, wherein said $(Sr,Ba,Ca)_2SiO_4:Eu$ phosphor comprises $(Sr_{0.95}Ba_{0.025} Eu_{0.025})_2SiO_4$ or $(Sr_{0.58}Ca_{0.036} Eu_{0.06})_2SiO_4$.

34. The phosphor blend of claim 33, wherein said phosphor blend is capable of absorbing the radiation emitted by a light source having a peak emission in the UV range and emitting radiation that, when combined with said radiation from said light source, produces white light.

35. The lighting apparatus of claim 1, wherein said semiconductor light source has a peak emission at about 405 nm.

36. A lighting apparatus for emitting white light comprising:
   a semiconductor light source emitting radiation having a peak emission in the UV; and
   a phosphor composition radiationally coupled to the light source, the phosphor composition comprising $(Sr,Ba,Ca)_2SiO_4:Eu$, and at least one phosphor selected from the group consisting of $((Sr,Mg,Ca,Ba,Zn)_2P_2O_7:Eu,Mn$; $(Ca,Sr,Ba,Mg)_5(PO_4)_3(Cl,F,OH):Eu,Mn$; and $(Sr,Ba,Ca)MgAl_{10}O_{17}:Eu,Mn$, wherein said $(Sr,Br,Ca)_2SiO_4:Eu$ phosphor comprises $(Sr_{0.95}Ba_{0.025} Eu_{0.025})_2 SiO_4$ or $(Sr_{0.58}Ca_{0.036} Eu_{0.06})_2SiO_4$.

* * * * *